United States Patent [19]

Stove et al.

[11] Patent Number: 5,189,427

[45] Date of Patent: Feb. 23, 1993

[54] FMCW RADAR LINEARIZER

[75] Inventors: Andrew G. Stove, Reigate, England; Michael B. Williams, Waterloo, Canada

[73] Assignee: U.S. Philips Corporation, New York, N.Y.

[21] Appl. No.: 727,190

[22] Filed: Jul. 9, 1991

[30] Foreign Application Priority Data

Jul. 11, 1990 [GB] United Kingdom ................. 9015261

[51] Int. Cl.$^5$ .............................................. G01S 13/34
[52] U.S. Cl. ..................................... 342/128; 342/200
[58] Field of Search ................................ 342/128, 200

[56] References Cited

U.S. PATENT DOCUMENTS 3,341,849 9/1967 Cordry et al. ........................ 343/14
4,106,020 8/1978 Johnson .............................. 342/128

FOREIGN PATENT DOCUMENTS 0048170 9/1981 European Pat. Off. .

OTHER PUBLICATIONS

P. Z. Peebles, Jr. & A. H. Green, Jr., "On Performance of a Linear FM Radar at 35 GHz", IEEE, 1982, pp. 4–7.
R. T. Lawner et al., "Coherent FM-CW Millimeter-Wave Radar Systems for Radar Cross Section Measurements", IEEE Transactions on Instrumention and Measurement, vol. 39, No. 1, Feb. 1990, pp. 208–211.

Primary Examiner—T. H. Tubbesing
Attorney, Agent, or Firm—Robert J. Kraus

[57] ABSTRACT

When linearizing FMCW radars it is customary to produce a synthetic target signal independently of the radar signal and to use the synthetic target signal to linearize the sweeping of the transmitted VCO frequency or the sampling of the radar IF signal to be analyzed. In order to reduce the overall number of microwave RF components, the present invention uses one mixer (18) to produce the radar IF and linearizing IF. In one embodiment an RF STALO (32) is coupled by a directional coupler (34) into the return path of the radar signal. In other embodiments (not shown) the mixer comprises a dc biased waveguide harmonic mixer and the STALO generates a lower frequency which is applied to the mixer by way of either the bias port or the radar IF output port. The linearizing arrangements (28) disclosed are based on known designs.

11 Claims, 4 Drawing Sheets

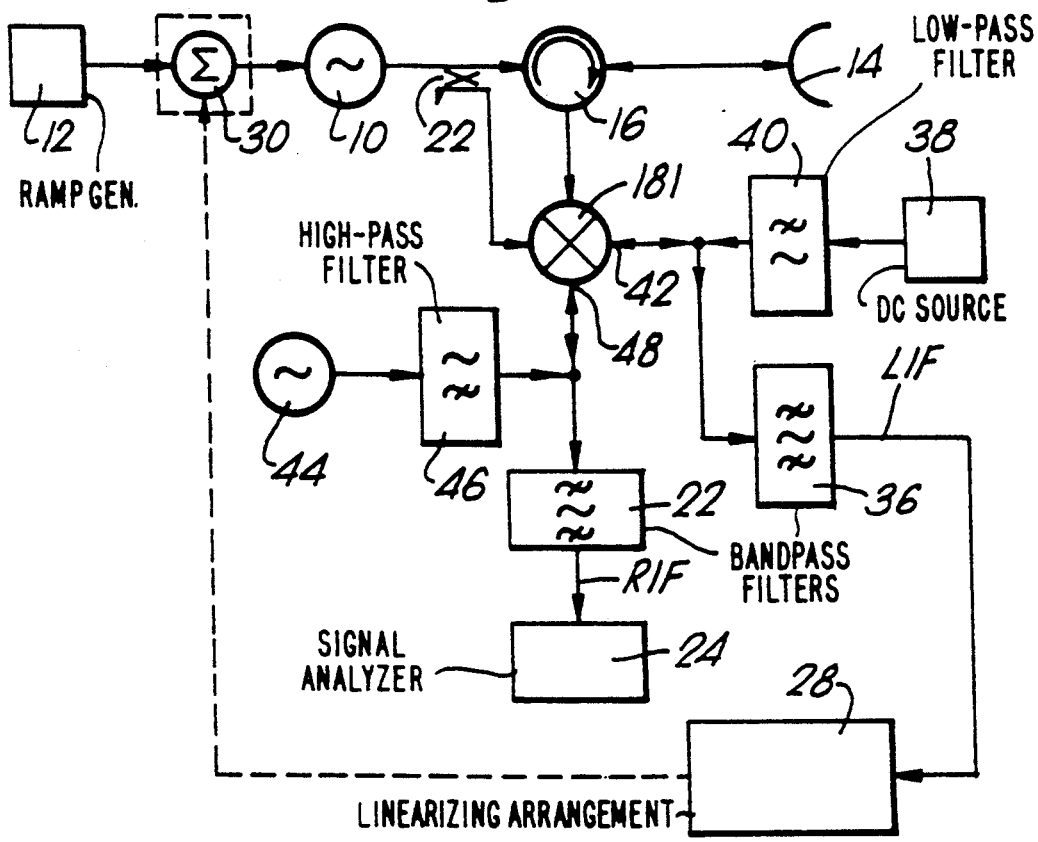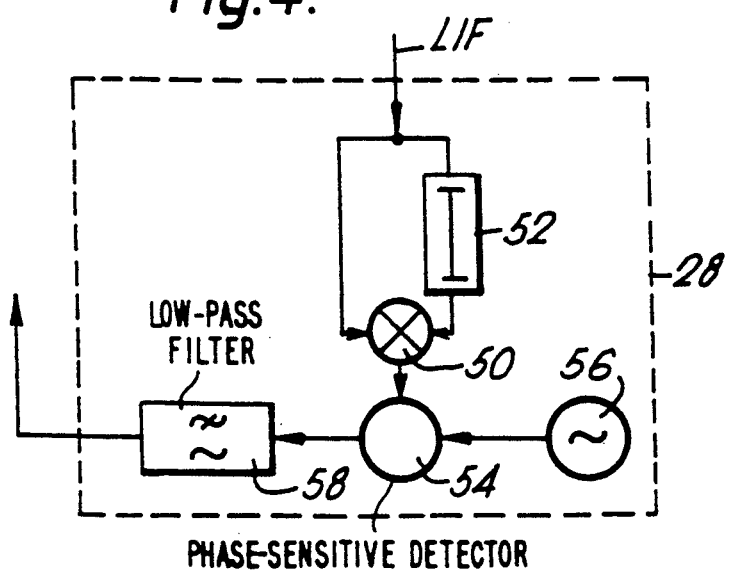

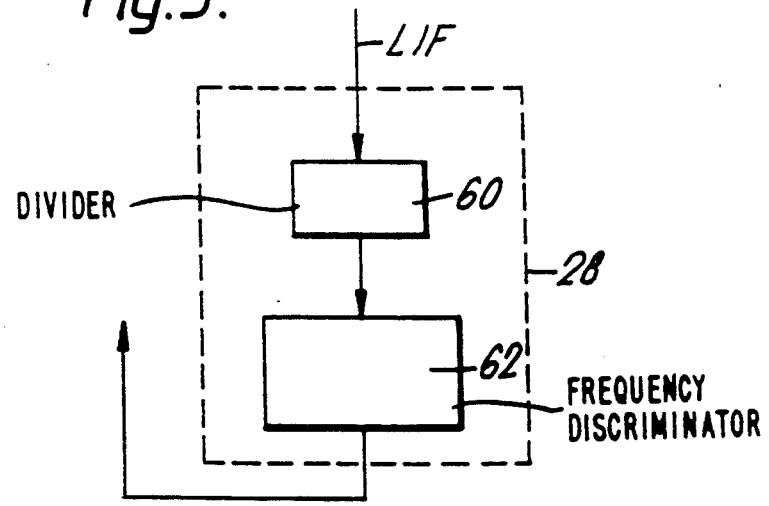
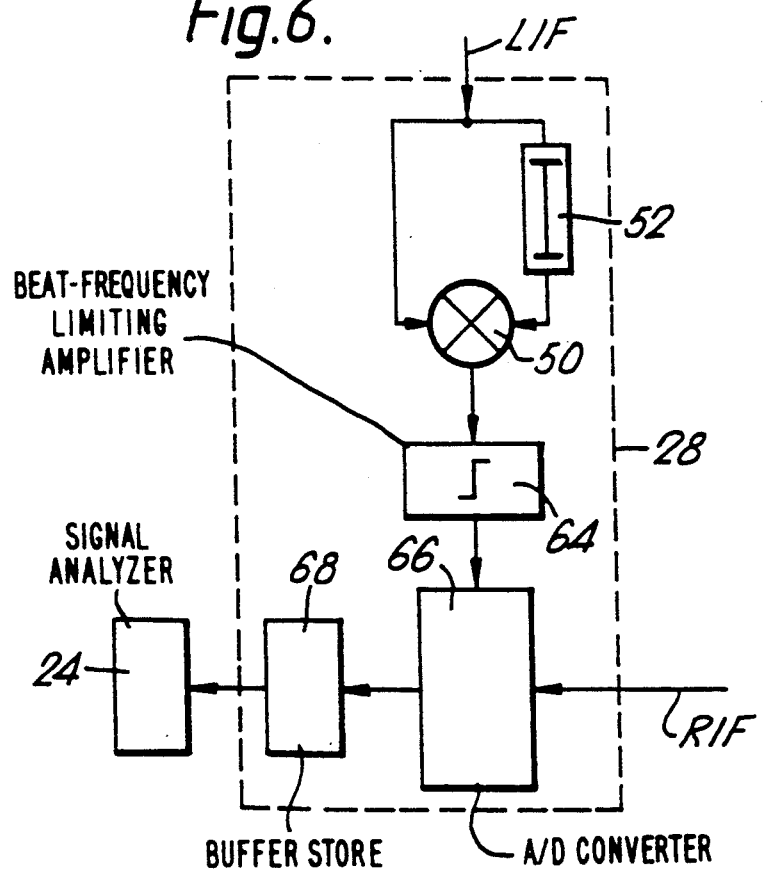

FMCW RADAR LINEARIZER

BACKGROUND ON THE INVENTION

The present invention relates to an FMCW radar linearizer and to an FMCW radar including such a linearizer.

FMCW radar linearizers are known per se. One example is disclosed by Peebles, P. Z. and Green, A. H., "On Performance of a Linear F. M. Radar Transmitter at 35 GHz", Proceedings of IEEE, Southcon, 1982. In summary, an artificial (or synthetic) target is produced using an rf time delay device to which the microwave rf signal is applied using an rf voltage controlled oscillator (VCO). The input signal to, and the output signal from, the time delay device are mixed together and the output signal is applied to a phase detector to which a reference oscillator is connected. Any shift in frequency from a constant value is detected and is used to produce a voltage proportional to the phase error. This voltage is amplified and fed back to the rf VCO with polarity reversal whereby it is used to reduce dynamically the original frequency error.

This article shows in FIG. 2 thereof a practical system in which, in order to avoid performance degradation due to direct leakage through the phase detector, two additional rf mixers are provided to which different local oscillator signals are provided. A first of these additional rf mixers is connected in the signal path between the rf VCO and the input to the time delay device and the second of these additional rf mixers is connected in the signal path to an input of the first mentioned mixer to which in the basic arrangement the undelayed rf VCO is applied. This refinement to the basic arrangement has been proposed in order to alleviate a phase detector leakage problem.

The time delay introduced in order to generate the artificial target is of the order of 20 ns. At frequencies of the order of 1.5 GHz such a time delay is normally produced by means of a coaxial cable which, at these frequencies, is very lossy, greater than 40dB. Such losses increase with increasing frequency.

A second order effect which results from generating an artificial target using a time delay of 20 ns is that it introduces high constraints on the linearizer. Accordingly the linearizer will not be operating in its optimum manner.

The drawbacks of this known linearizer are that it operates at microwave frequencies which means that the components such as mixers are costly, delay devices are lossy and high constraints are imposed on the linearizer.

SUMMARY OF THE INVENTION

It is an object of the present invention to overcome these drawbacks in linearizing an FMCW radar.

According to the present invention there is provided an FMCW radar comprising an RF voltage controlled oscillator (VCO), means for successively sweeping the VCO frequency over a defined range, signal operating means for radiating the transmitter signal and for receiving at least the return signal, a stable local oscillator (STALO), a mixer having a plurality of ports to which are applied the return signal, a local oscillator signal derived from the VCO and a signal from the STALO and from which are derived a radar IF signal and a linearizer IF signal, and a linearizing arrangement having an input for receiving the linearizer IF signal.

The present invention is based on the recognition of the facts that a single mixer can be used to produce both the radar and linearizer IF signals and that the linearizer IF signal is a UHF signal so that a linearizer which generates an artificial target can use a more efficient delay device such as a SAW device which has a low loss compared to coaxial cable. In choosing a time delay for the delay device it should be comparable to the delay resulting from the detection of a real target.

In one embodiment of a radar made in accordance with the present invention the STALO output is coupled to the return signal path by a directional coupler having a coupling factor such that the pulling of the STALO output is minimized and the loss of the return signal is very low.

In other embodiments of a radar made in accordance with the present invention the mixer is a dc biased harmonic mixer having ports for the local oscillator and return signals, a dc bias and an IF output. A STALO is coupled to the dc bias port. The STALO has a lower frequency than in the above described embodiment because a harmonic of its frequency is used to produce the desired linearizer IF frequency. In a variant of this embodiment, the STALO is coupled to the port of the mixer from which the radar IF signal is derived and the linearizing IF signal is derived from the port to which the dc bias is applied.

If desired the output of the linearizing arrangement may be used for linearizing the output of the VCO frequency sweeping means. Alternatively the linearizing arrangement may be configured to linearize the sampling of digitized radar IF signals held in a buffer store.

An embodiment of a linearizing arrangement for linearizing the output of the VCO frequency sweeping means comprises means for producing a synthetic target signal from the linearizing IF signal, phase sensitive detecting means having a first input for the synthetic target signal and a second input coupled to a second STALO and in that an output signal is coupled to low pass filtering means which provides an error signal to be supplied to the VCO frequency sweeping means.

When implementing the low pass filtering means in the above-mentioned linearizing arrangement it has been found advantageous to configure the amplitude roll-off characteristic so as to be initially very steep and then be less steep as the unity gain point is approached. By arranging the roll-off characteristic to be configured in this way high gain is achieved at low frequencies together with a relatively shallow roll-off near the unity gain point. Such a shallow roll-off avoids stability problems as the unity gain point is approached.

Since the fundamental frequency of the second STALO and its harmonics are present in the output of the phase sensitive detecting means, the low pass filtering means includes high Q sharp trap filters to remove these unwanted frequencies which may affect adversely the VCO. In order to avoid any possible instability resulting from the provision of the trap filters, the unity gain frequency is lower than the second STALO frequency so that the loop cannot oscillate at the trap frequencies.

The low pass filtering means may be implemented in at least two stages with one of the stages being physically close to the VCO and a second of the stages being physically close to the phase sensitive detecting means.

By implementing the low pass filtering means in this way noise and spurious signals present in the vicinity of the VCO are removed as well as high level harmonics produced by the phase sensitive detecting means.

BRIEF DESCRIPTION OF THE DRAWINGS

The present invention will now be described, by way of example, with reference to the accompanying drawings, wherein;

FIGS. 1, 2 and 3 are block schematic diagrams representing different embodiments of an FMCW radar made in accordance with the present invention, FIGS. 4, 5 and 6 are block schematic diagrams representing different embodiments of a linearizing arrangement which can be used with any one of the radars shown in FIGS. 1, 2 and 3, FIGS. 7 and 8 are respectively amplitude-frequency and phase-frequency characteristics of the low pass filter 58 shown in FIG. 4.

In the drawings the same reference numerals have been used to indicate corresponding features.

DESCRIPTION OF THE PREFERRED EMBODIMENTS

Figure 1:
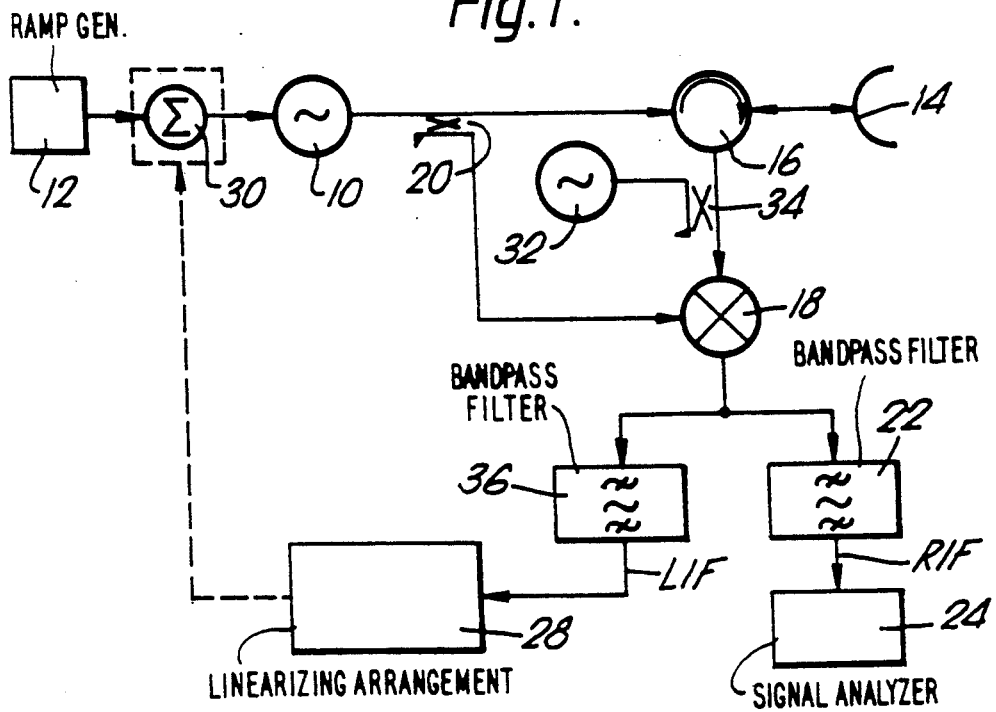

Referring to FIG. 1, the FMCW radar comprises a voltage controlled microwave oscillator (VCO) 10 which generates a signal on or about a center frequency of 90 GHz. The frequency of the VCO 10 is swept by a ramp generator 12 which ideally produces a linearly ramped bias voltage which is supplied to the VCO 10. However, if the tuning characteristic of the VCO is not perfect, the frequency sweep will not be linear. The output signal from the VCO 10 is sent to antenna 14 by way of a non-reciprocal means, such as a circulator 16, which serves to separate the transmitted and the received return signals. An RF mixer 18 has one port connected to the circulator 16 and another port for a local oscillator signal which is derived from the VCO 10 output by a directional coupler 20. A frequency down-converted radar IF signal RIF, which has a frequency of the order of 1 MHz, is derived using a bandpass filter 22 and is applied to a signal analyzer 24. The basic operation of an FMCW radar is well known and it suffices to say that the return signal is essentially a replica of the transmitted signal except that it is displaced in time. Assuming that the sweep rate is constant, the difference frequency is proportional to the target range. However, if the sweep rate is varied, that is non-linear, then the difference frequency between the transmitted and received signals will not be a good indication of range.

There are various methods by which the sweep rate may be made constant (or linearized). Three examples will be described later with respect to FIGS. 4, 5 and 6. However, each example requires a stable local oscillator (STALO) to generate a linearizer intermediate frequency LIF for use by a linearizing arrangement 28. In one method of linearizing the sweep rate an error correcting voltage is derived which is applied with polarity reversal to a summing stage 30 in which it alters the linearly ramped bias voltage as required. In another method the linearly ramped bias voltage is not adjusted and as a result the summing stage 30 is optional.

In FIG. 1 a STALO 32 generating a microwave frequency of the order of 90 GHz is coupled to the line interconnecting the circulator 16 and the mixer 18 by means of a directional coupler 34. The STALO frequency and the received return signal are simultaneously mixed with the local oscillator signal derived from the VCO 10 to provide a linearizer intermediate frequency LIF of the order of 500 MHz and an RIF of 1 MHz. The respective signals are separated using bandpass filters 36 and 22. Compared to the known linearizer disclosed in the preamble, the embodiment shown in FIG. 1 only requires one rf mixer 18 which is a considerable cost saving. Furthermore, the LIF is at UHF rather than at microwave frequencies.

When implementing the embodiment shown in FIG. 1, the required rf level can be very low so that the STALO 32 power output may be much reduced. Also the coupling factor of the directional coupler 34 is sufficiently low that STALO pulling is minimized and the loss of the received rf signal from the antenna 14 is very low.

Figure 2:
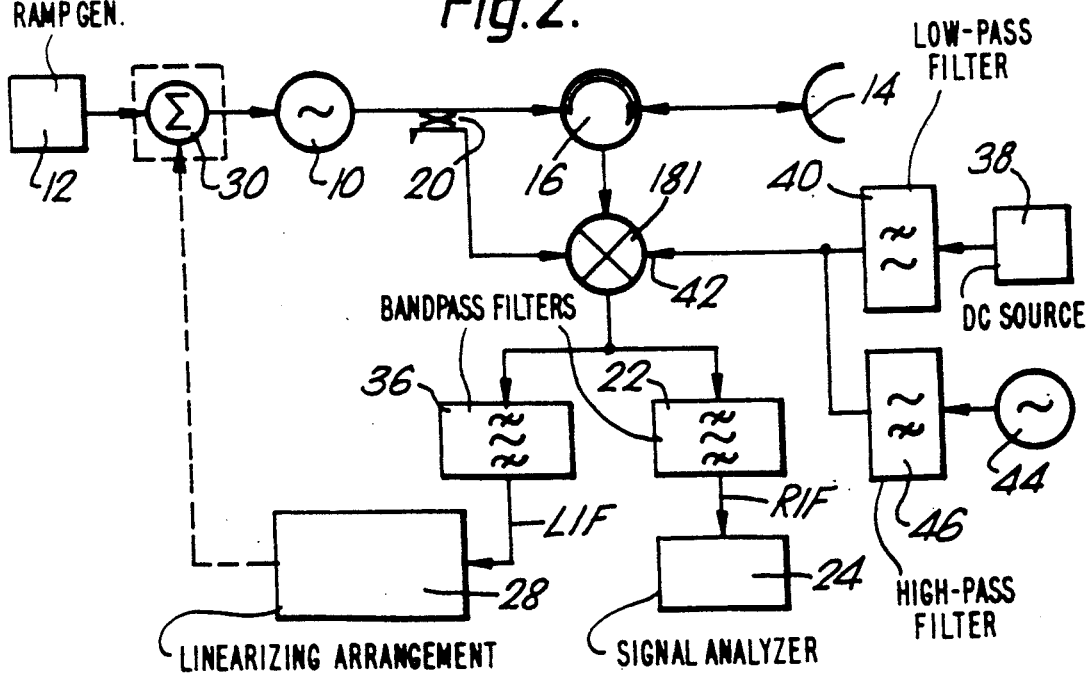

FIG. 2 shows an embodiment of the invention which in many respects is similar to that shown in FIG. 1. However, it differs from FIG. 1 in that the mixer is a dc biased mixer 181. A dc source 38 is coupled by way of a low pass filter 40 to a bias port 42 of the mixer 181. A STALO 44 having a frequency of the order of 8.95 GHz is connected by way of a high pass (or dc blocking) filter 46 to the bias port 42. The tenth harmonic of the STALO 44 frequency is 89.5 GHz. In the mixer 181 the VCO 10 frequency, the received return signal and the STALO 44 frequency mix harmonically to produce as wanted outputs a 1 MHz RIF and a 500 MHz LIF. These signals are separated from the other products of mixing by the bandpass filters 22,36 and processed as described with reference to FIG. 1.

Using a lower frequency STALO 44 connected to the bias port of the mixer 181 as compared to the millimeter-wave STALO 32 of FIG. 1 gives the advantages of saving a directional coupler, compactness and cheapness. Conveniently, the STALO 44 may be implemented as a simple, compact monolithic circuit.

FIG. 3 illustrates an embodiment of the invention which is a variant on that shown in FIG. 2. In the interests of brevity, only the differences between FIGS. 2 and 3 will be described. The mixer 181 is a dc biased mixer having the dc bias applied to the port 42. The STALO 44, having a frequency of 8.95 GHz, is applied to the IF output port 48 of the mixer 181 by way of a high pass filter 46. The filter 22 is also connected to the port 48 to derive the RIF. The filter 36 for extracting the LIF is connected to the bias port 42. The embodiment of FIG. 3 has substantially the same advantages as that of FIG. 2 over the embodiment of FIG. 1.

The linearizer arrangement 28 shown in FIG. 4 is of known design. The LIF from the bandpass filter 36 (FIGS. 1, 2 and 3) is applied to a first input port of a UHF mixer 50 and to an input of a UHF delay device 52, such as a SAW device, the output of which is connected to a second input port of the mixer 50. The time delay introduced by the delay device 52 is representative of the combined transmission and return times of a synthetic target having a range comparable to that of a real target. The output from the mixer 50 is a frequency difference signal representative of the range of the synthetic target. This frequency difference (or beat) signal is applied to one input port of a phase sensitive detector 54, to a second input port of which a low frequency STALO 56 is connected. The output from the phase sensitive detector 54 is low pass filtered in a filter 58 to form an error signal which is applied to the summing stage 30 (FIGS. 1, 2 and 3) in which it modifies the sweep voltage applied to the VCO 10 as required. Thus the provision of a low frequency, phased locked loop keeps the synthetic target frequency locked to STALO 56 and hence forces a linear frequency sweep of the VCO 10.

As is generally known, the low pass filter 58 is provided to obtain loop stability in practice. In FIG. 4, the filter 58 is required to have a number of characteristics. Firstly, it should have as much gain as possible to minimize the errors in the loop. As a result, the effect of component imperfections on the loop is less and also the output of the feedback control system follows the input more accurately. Secondly, the overall loop gain must be less than unity when the phase shift around the loop is equal to 360 degrees or else the loop will oscillate.

Typically, in applications involving the use of low pass filters in control loops, the amplitude characteristic of the loop filter rolls-off at 6 dBs per octave to introduce a 90 degrees phase shift from the filter. The negative feedback in the loop introduces another 180 degrees at dc. Making the loop response any steeper leads to other problems due to the fact that the steeper the slope is made the greater the phase shift at the frequency at which the gain becomes equal to or less than unity which in turn is likely to cause the frequency to become unstable.

Figure 7:
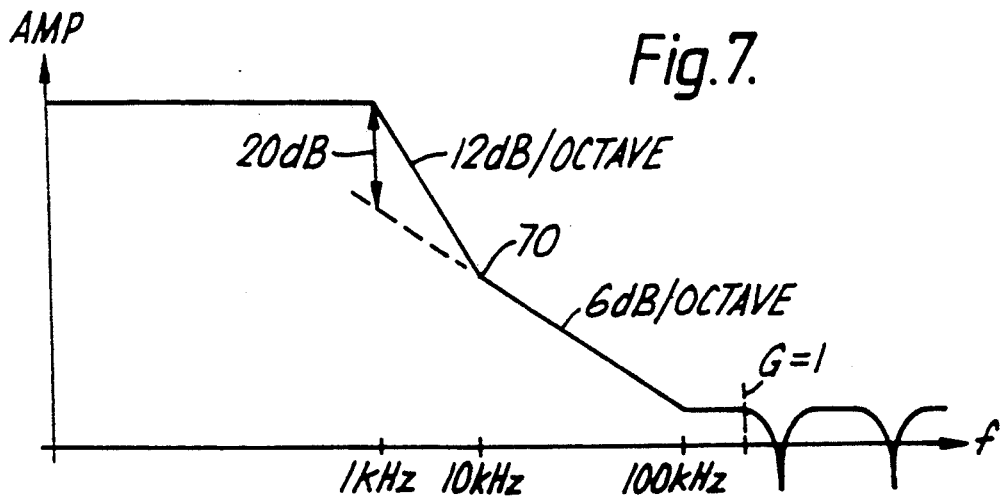

This problem can be avoided by modifying the loop roll-off as shown in FIG. 7 so that between the frequencies of 1 KHz and 10 KHz the gain decreases at 12 dB per octave and then between 10 KHz and 100 KHz the gain decreases more slowly at 6 dB per octave down to unity gain level (G=1). The break point 70 is chosen to give a phase lag which is acceptably low. At 1 KHz the gain is 20 dB higher than would be the case if a 6 dB per octave characteristic was maintained over the frequency range 1 KHz to 10 KHz.

This technique is attractive when, as in the present case, the loop includes a delay line, the phase shift of which increases linearly with frequency, so that the phase shift it causes in the loop is significant at high frequencies, but negligible at lower frequencies.

Figure 8:
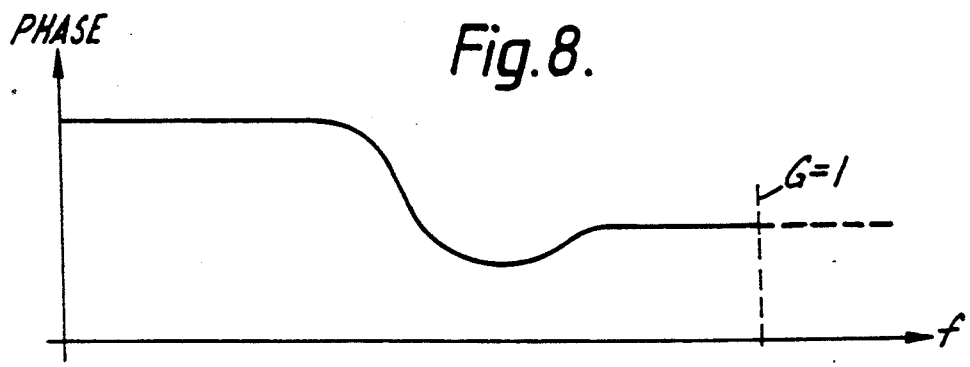

FIG. 8 shows the frequency-phase characteristic of the filter 58 and illustrates the phase swing which occurs around the break point 70 in the amplitude-frequency curve. The low pass filter 58 is constructed in such a way as to obtain these characteristics.

When the linearizing arrangement shown in FIG. 4 is used in conjunction with the FMCW radar shown in FIG. 1, the phase sensitive detector 54 generates harmonics of the STALO 56 at a very high level which can get back to the VCO 10 upsetting its spectrum. Typically the frequency of the STALO 56 is of the same order as that of the RIF. In order to avoid this problem, sharp trap filters 72,74 (FIG. 9) are provided to remove the fundamental frequency and the harmonics of the STALO 56. Unless care is taken, the provision of sharp trap filters in the feedback loop can make the loop go unstable. This risk of instability is avoided by making sure that the unity gain frequency is lower than the STALO frequency so that the loop cannot oscillate at the trap frequencies. Furthermore, the sharp trap filters must have a high Q so that they contribute negligible phase shift at those frequencies where the gain is unity.

Figure 9:
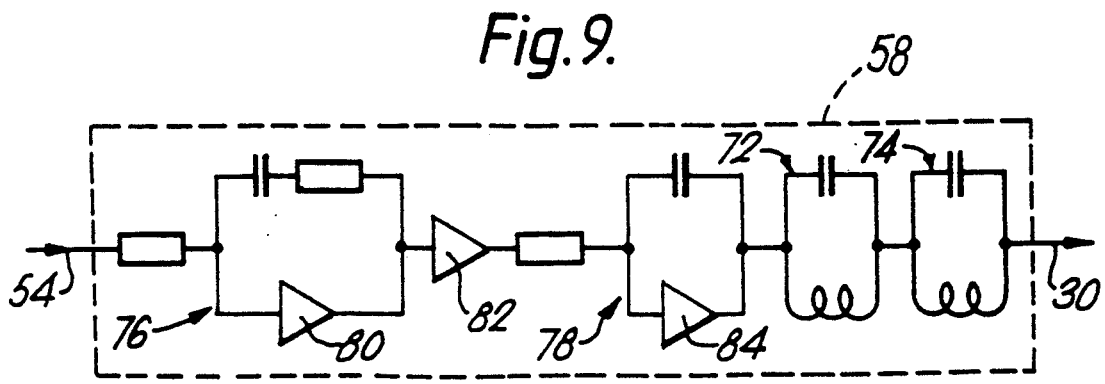
FIG. 9 is a schematic circuit diagram of an embodiment of the low pass filter 58.

Additionally it is desirable to implement the low pass filter 58 in two stages 76,78 as shown in FIG. 9. The stage 78, which provides the high-frequency roll-off, is best placed physically close to the VCO 10 so that it filters noise and spurious signals in the filter area itself. The other stage 76 is disposed close to the phase sensitive detector 54 to filter the high level of harmonics from the detector and to prevent them from overloading amplifiers 80,82,84 provided in the low pass filter 58 to produce an overall amplification.

The linearizing arrangement 28 shown in FIG. 5 comprises a high speed digital circuit. The LIF at UHF frequency is applied to a divider 60 which divides down the LIF by a fixed divisor, for example 10, to produce a digital output. A frequency discriminator 62 generates a ramp which is a replica of the voltage ramp applied to the VCO 10. This replica ramp signal is compared with the voltage ramp from the ramp generator 10 in the summing stage 30 which functions as a subtractor to provide an error corrected ramp voltage to drive the VCO 10.

FIG. 6 shows a third example of a linearizing arrangement 28 which differs from those shown in FIGS. 4 and 5 in that it does not use the summing stage 30 (FIGS. 1, 2 and 3) to correct the generated ramp voltage. This arrangement is of a type described in European Patent Specification 0 048 170 B1.

The LIF which is a UHF frequency is used to provide a synthetic target signal at the output of the mixer 50. Since no attempt is made to linearize the sweep of the VCO 10 (FIGS. 1, 2 and 3), the beat frequency at the output of the mixer 50 varies with the rate of change of the frequency of the sweep signal. The beat frequency is amplified and hard limited in a stage 64 to produce as an output a signal in which the zero-crossings are linear in frequency of the rf signal. The hard limited signal comprises a clock signal for an analog to digital converter (ADC) 66 which is used to digitize the RIF. The digital signals from the ADC 66 are supplied to a buffer store 68 at a non-constant rate determined by the beat frequency from the mixer 50. The stored digitized values are sampled linearly in rf frequency rather than in time and supplied to the signal analyzer 24.

Although the present invention has been described with reference to FMCW radars, the principles of deriving at least two IF using a single mixer can be applied to other radars besides FMCW and to other microwave systems than radars.

When implementing embodiments of the present invention, it is possible to use separate transmit and receive antennas. In such cases the VCO signal is applied as the transmit signal direct to the transmit antenna, the circulator 16 having been omitted, and the received signal is applied to the relevant port of the mixer 18, 181.

In the interests of clarity, no discussion has been made of reflected power cancellation and other leakage suppression techniques because they are of no direct relevance to the invention of the present application.

From reading the present disclosure, further or alternative variations and combinations will be apparent to persons skilled in the art. Such variations may involve other features which are already known in the design, manufacture and use of radar and other microwave systems and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. An FMCW radar comprising an rf voltage controlled oscillator (VCO), means for successively sweeping the VCO frequency over a defined range, signal operating means for radiating the transmitter signal and for receiving at least the return signal, a stable local oscillator (STALO), a mixer having a plurality of ports to which are applied the return signal, a local oscillator signal derived from the VCO and a signal from the STALO and from which are derived a radar IF signal and a linearizer IF signal, and a linearizing arrangement having an input for receiving the linearizer IF signal.

2. A radar as claimed in claim 1, characterized in that the STALO output is coupled to the return signal path by a directional coupler having a coupling factor such that the pulling of the STALO output is minimized and the loss of the return signal is very low.

3. A radar as claimed in claim 1, characterized in that the mixer is a dc biased harmonic mixer, in that a bias source and the STALO are coupled to the same mixer port by way of respective filters, in that the radar IF and the linearizer IF are derived from the same port and in that filtering means are provided for separating the respective radar and linearizing IFs.

4. A radar as claimed in claim 1, characterized in that the mixer is a dc biased harmonic mixer, in that the STALO is coupled by way of a filter to a port of the mixer from which the radar IF is derived, and in that a bias source is connected by way of a filter to another port of the mixer, from which another port a filter is connected for deriving the linearizing IF.

5. A radar as claimed in any one of claims 1 to 4, characterized in that the output of the linearizing arrangement is used for linearizing the output of the VCO frequency sweeping means.

6. A radar as claimed in claim 5, characterized in that the linearizing arrangement comprises means for producing a synthetic target signal from the linearizing IF signal, phase sensitive detecting means having a first input for the synthetic target signal and a second input coupled to a second STALO and in that an output signal is coupled to low pass filtering means which provides an error signal to be supplied to the VCO frequency sweeping means.

7. A radar as claimed in claim 6, characterized in that the amplitude roll-off of the low pass filtering means is configured to be relatively steep initially and then be less steep as the unity gain point is approached.

8. A radar as claimed in claim 6, characterized in that the low pass filtering means comprises high Q sharp trap filters to remove the fundamental frequency of the second STALO and its harmonics present in the output of the phase sensitive detecting means and in that the unity gain frequency of the low pass filtering means is lower than the fundamental frequency of the second STALO.

9. A radar as claimed in claim 6, characterized in that the low pass filtering means is implemented in at least two stages, in that one of the said stages is arranged to be physically close to the VCO and in that a second of the said stages is arranged to be physically close to the phase sensitive detecting means.

10. A radar as claimed in claim 5, characterized in that the linearizing arrangement comprises a frequency divider having an input for the linearizing IF signal and in that a frequency discriminator is coupled to an output of the frequency divider, said frequency discriminator generating a ramp voltage which is supplied to the VCO frequency sweeping means to keep the actual frequency the same as the input demand frequency.

11. A radar as claimed in any one of claims 1 to 4, characterized in that the linearizing arrangement comprises means for producing a synthetic target signal from the linearizing IF signal, means for detecting zero crossings in the synthetic target signal, analog to digital converter (ADC) means having an input for the radar IF signal and a clock input coupled to an output of the zero crossing detecting means, a buffer store coupled to receive the digitized output of the ADC means, and means for supplying the digitized signals in the buffer store to a radar signal analyzing means.

* * * * *